United States Patent
Shin et al.

(10) Patent No.: US 6,184,077 B1
(45) Date of Patent: Feb. 6, 2001

(54) METHOD FOR FABRICATING CROWN-TYPE CAPACITOR OF SEMICONDUCTOR DEVICE

(75) Inventors: Seung-Woo Shin; Yong-Sun Sohn, both of Kyunggi-do (KR)

(73) Assignee: Hyundai Electronics Industries Co., Ltd, Kyunggi (KR)

( * ) Notice: Under 35 U.S.C. 154(b), the term of this patent shall be extended for 0 days.

(21) Appl. No.: 09/441,845

(22) Filed: Nov. 17, 1999

(30) Foreign Application Priority Data

Dec. 30, 1998 (KR) .................................................. 98-62543

(51) Int. Cl.⁷ ............................................... H01L 21/8242
(52) U.S. Cl. ............................................ 438/241; 438/253
(58) Field of Search ..................................... 438/210, 241, 438/253, 254, 396, 397

(56) References Cited

U.S. PATENT DOCUMENTS

| | | | |
|---|---|---|---|
| 5,712,202 | 1/1998 | Liaw et al. | 438/253 |
| 5,895,250 | * 4/1999 | Wu | 438/253 |
| 5,930,623 | * 7/1999 | Wu | 438/253 |
| 6,087,216 | * 4/1999 | Wang | 438/253 |

* cited by examiner

*Primary Examiner*—Chandra Chaudhari
(74) *Attorney, Agent, or Firm*—Crompton, Seager & Tufte, LLC

(57) ABSTRACT

A method for fabricating a crown-type capacitor of a semiconductor device includes the steps of: forming a plurality of bit lines on the interlevel dielectric layer in a cell region and a periphery region of a substrate; forming a third oxide layer to fill gaps existing between the plurality of bit lines in the cell region; forming an etch-blocking layer and a first oxide layer over the entire structure obtained by forming the third oxide layer; forming a plurality of via-holes by anisotropically etching the first oxide layer, etch-blocking layer and third oxide layer, to expose the interlevel dielectric layer in the cell region; forming a silicon conductive layer, for forming a lower electrode of the crown-type capacitor, over the cell region of the structure having the plurality of via-holes to make electrical contact with the interlevel dielectric layer, and then forming a second oxide layer; completing the lower electrode by anisotropically etching the second oxide layer and the silicon conductive layer, to expose the first oxide layer; and removing the first and second oxide layers.

10 Claims, 5 Drawing Sheets

METHOD FOR FABRICATING CROWN-TYPE CAPACITOR OF SEMICONDUCTOR DEVICE

BACKGROUND OF THE INVENTION

1. Field of the Invention

The present invention relates to semiconductor memory device fabrication and, more particularly, to a method for fabricating a crown-type capacitor whose lower electrode (storage electrode) is formed using a triple-layer technique.

2. Discussion of the Related Art

In the manufacture of semiconductor memory devices, cell capacitance is inherently reduced with any decrease in memory cell area, which is required for higher levels of DRAM integration. As the primary obstacle to increased integration, reduced cell capacitance results in a drop off in the ability of a memory cell to read out data, causes difficulties in low-voltage operation, and tends to increase soft error rates. Therefore, to realize highly integrated semiconductor memory devices, e.g., DRAMs, the cell capacitance problem must be addressed.

Recently developed three-dimensional capacitors may be classified in accordance with the structure of the lower electrode of the capacitor. Examples include pin-type, box-type, cylindrical, and crown-type lower electrodes. In particular, the crown-type capacitor has received much attention in research due to its suitability for semiconductor devices having a design rule of 0.20 μm or less. Conventionally, a single-layer technique is used in forming the lower electrode of a crown-type capacitor.

FIGS. 1 to 5 are cross-sectional views illustrating various steps for fabricating a crown-type capacitor of a semiconductor device in accordance with a conventional technique.

To begin with, a plurality of word lines (not shown) are formed on a semiconductor substrate (not shown), and then an interlevel dielectric layer 10 which is composed of borophosphorous silicate glass (BPSG) and comprises a cell region and a periphery region of a substrate. After a nitride film (not shown) is deposited over the entire structure on which the bit lines 20 are formed, the nitride film in the periphery region is anisotropically etched until the interlevel dielectric layer 10 is exposed.

As a result, the bit lines 20 in the cell region are capped with the nitride film, whereas those in the periphery region are covered with the nitride film only on their sidewalls in order to form spacers. The nitride film allows a silicon conductive layer (to be described with respect to FIG. 2) to be self-aligned with the cell region while in contact with the interlevel dielectric layer 10 but not so as to create an electrical short between the bit lines 20.

Thereafter, a first oxide layer 30, also composed of undoped silicate glass (USG) or BPSG, is deposited over the entire structure obtained after etching the nitride film, so as to fill the gaps between the bit lines 20. An anti-reflective coating (ARC) layer 40 is then formed over the first oxide layer 30.

Referring to FIG. 2, first, the ARC layer 40 and the first oxide layer 30 are anisotropically etched until the interlevel dielectric layer 10 of the cell region is exposed, thereby forming via-holes. Next, a silicon conductive layer 50 for forming the lower electrode is deposited over the entire structure having the via-holes formed therein. The silicon conductive layer 50 is electrically connected to the semiconductor substrate through a contact plug (not shown) formed in the interlevel dielectric layer 10.

At this time, as described above, the silicon conductive layer 50 is self-aligned and in contact with the interlevel dielectric layer 10 but not so as to electrically short the bit lines 20. A second oxide layer 60 is then deposited over the entire structure resulting from the deposition of the silicon conductive layer 50, so as to fill the remainder of the via-holes, i.e., atop the formation of the silicon conductive layer.

Referring to FIGS. 3 and 4, the second oxide layer 60 is firstly subjected to isotropic etching to expose the top surface of the silicon conductive layer 50. In this case, the second oxide layer 60 may remain over the silicon conductive layer 50 in the periphery region. Thereafter, the silicon conductive layer 50 and ARC layer 40 are isotropically etched until the top surface of the first oxide layer 30 is exposed, thereby completing a lower electrode 50a which serves as the capacitor's storage electrode.

FIG. 5 illustrates the problem of the conventional art. That is, the oxide material of the layers 30 and 60 is removed by a wet etching, which also results in the removal of surface portions of the interlevel dielectric layer 10 thus creating "loss" areas A. As a consequence, other parts of the interlevel dielectric layer 10 tend to fill the loss area A during a subsequent annealing process, which causes a shifting of the bit lines 20 and may even result in the collapse of the bit lines and an electrical connection (shorting) with nearby conductors.

To prevent this phenomenon, it has been suggested to leave a predetermined thickness of the first oxide layer 30 after the wet etching step, that is, to carry out an incomplete etching step. In this case, however, minute cracks may form in the periphery region of the first oxide layer 30, which is left relatively thin, due a thermal stress caused by the annealing process. In addition, an incomplete etching of the first oxide layer 30 results in the incomplete removal of the second oxide layer 60. This excess (unremoved) portion of the second oxide layer 60 causes imperfections in the inner sidewall surface of the lower electrode 50a, resulting in reduced reliability of the electrical characteristics of the capacitor.

It is preferred to form the first oxide layer 30 using a suitable material, one which does not crack, and to etch the layer so as to leave at least some of the material intact. However, it has proved impossible to do so while completely removing the second oxide layer 60. More particularly, the first oxide layer 30 should, without cracking, completely fill the gaps between the bit lines 20 without a void. In this regard, the conventional art suffers from the problem that no suitable material has been found to satisfy the conditions of the complete removal of the second oxide layer 60 and filling the gaps without the void.

As described above, the conventional method for fabricating a crown-type capacitor, which forms the lower electrode using a single layer, i.e., the first oxide layer 30, cannot completely overcome the shifting of the bit lines 20 by the flowing of the interlevel dielectric layer 10 when the lower electrode 50a is formed, and the subsequent collapse or shorting.

SUMMARY OF THE INVENTION

Therefore, it is an object of the present invention to overcome the above problems encountered in the conventional art.

It is another object of the present invention to provide a method for fabricating a crown-type capacitor of a semiconductor device, capable improving the reliability of the capacitor of the semiconductor device.

It is yet another object of the present invention to provide a method for fabricating a crown-type capacitor of a semiconductor device, which prevents the loss of an interlevel dielectric layer during an etching step.

It is still another object of the present invention to provide a method for fabricating a crown-type capacitor of a semiconductor device, which prevents the shifting and collapse of bit lines due to a loss in an interlevel dielectric layer.

It is still yet another object of the present invention to provide a method for fabricating a crown-type capacitor of a semiconductor device, which allows the full removal of oxide layers without degrading capacitor reliability.

It is a further object of the present invention to provide a method for fabricating a crown-type capacitor of a semiconductor device, which prevents the peripheral region cracking of an oxide layer for forming the capacitor.

It is still a further object of the present invention to provide a method for fabricating a crown-type capacitor of a semiconductor device, which prevents the interlevel dielectric layer from flowing as well as maintaining the surface area of a lower electrode to ensure capacitor reliability.

It is yet a further object of the present invention to provide a method for fabricating a crown-type capacitor of a semiconductor device, which provides an advantage in that the bit lines are insulated from the upper electrode of the capacitor without an additional process.

To accomplish the above object, there is provided a method for fabricating a crown-type capacitor of a semiconductor device, according to the present invention. The method comprises forming a plurality of bit lines on the interlevel dielectric layer in a cell region and a periphery region of a substrate; forming a third oxide layer to fill gaps existing between the plurality of bit lines in the cell region, the third oxide layer covering on the sidewalls of the bit lines; forming an etch-blocking layer using CVD and a first oxide layer over the entire structure obtained by forming the third oxide layer; forming a plurality of via-holes by anisotropically etching the first oxide layer, the etch-blocking layer and the third oxide layer, to expose the interlevel dielectric layer in the cell region; forming a silicon conductive layer, for forming a lower electrode of the crown-type capacitor, over the cell region of the structure having the plurality of via-holes to make electrical contact with the interlevel dielectric layer, and then forming a second oxide layer to fill interspaces of the silicon conductive layer in the cell region; completing the lower electrode by anisotropically etching the second oxide layer and the silicon conductive layer, to expose the first oxide layer; and removing the first and second oxide layers.

In the present invention, the interlevel dielectric layer and the third oxide layer are composed of a BPSG layer and an $O_3$-TEOS layer, respectively. The etch-blocking layer is an HTO layer, LPTEOS layer or PETEOS layer. The first an second oxide layers are a BPSG layer and a PSG layer, respectively. The BPSG layer, i.e., the first oxide layer, contains boron and phosphorous of 2% by weight and phosphorous of 5% by weight, and the PSG layer cantains phosphorous ranging between 3% and 5% by weight. To remove the first and second oxide layers, the present invention provides a wet etching step which uses a chemical liquid whose ratio of heavy water to hydrofluoric acid is between 100:1 and 150:1. The etch-blocking layer protects the interlevel dielectric layer during the removal of the capacitor oxide layer and lower electrode filling oxide layer, so that no loss of the interlevel dielectric layer occurs and the bit lines do not shift or collapse.

BRIEF DESCRIPTION OF THE DRAWINGS

The above and other objects and aspects of the invention will become apparent from the following description of embodiments with reference to the accompanying drawings, in which.

DETAILED DESCRIPTION OF THE PREFERRED EMBODIMENTS

Figure 6:
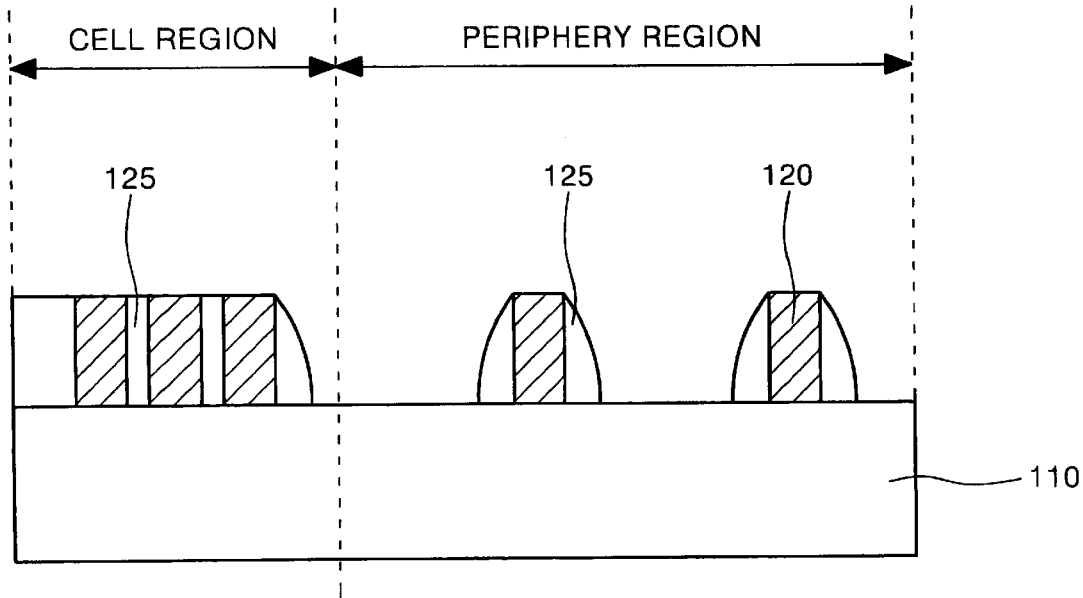
FIGS. 6 to 10 are cross-sectional views illustrating various steps of a method for fabricating a crown-type capacitor of a semiconductor device in accordance with the preferred embodiment of a present invention.

Referring to FIG. 6, a plurality of word lines (not shown) are formed on a semiconductor substrate (not shown), and then an interlevel dielectric layer 110 as shown in FIG. 6 is formed over the entire structure where the word lines are made.

Referring to FIG. 6, a plurality of bit lines 120 are formed on an interlevel dielectric layer 110 which is composed of BPSG and comprises a cell region and a periphery region of a substrate. After a nitride film (not shown) is deposited over the entire structure on which the bit lines 120 are formed, the nitride film in the periphery region is anisotropically etched until the interlevel dielectric layer 110 is exposed.

As a result, the bit lines 120 in the cell region are capped with the nitride film, whereas those in the periphery region are covered with the nitride film only on their sidewalls in order to form spacers. The nitride film allows a silicon conductive layer (to be described with respect to FIG. 8) for the lower electrode to be self-aligned with the cell region while in contact with the interlevel dielectric layer 110 but not so as to create an electrical short between the bit lines 120.

Further, it is the object of removing the nitride film in the periphery region by the anisotropic etching to prevent minute cracks from being produced in the periphery region by a thermal stress caused at the nitride film while the following annealing process.

Thereafter, a third oxide layer 125 is deposited over the entire structure obtained after forming the bit lines 120, so as to fill the gaps between the bit lines. It is preferred that the third oxide layer 125 is made of a tetraethyl-ortho-silicate ($O_3$-TEOS:Si($OC_2H_5$)$_4$) produced by reacting $O_3$ with TEOS using atmospheric-pressure chemical vapor deposition (APCVD), which can completely fill the gaps, i.e., without creating a void. If voids are present in the third oxide layer 125, a foreign substance may be introduced to the contact area when via-holes are formed for a self-aligned contact (to be described with respect to FIG. 8), resulting in the degradation of the electrical reliability in the capacitor. Further, silicon would be deposited into the void when the silicon conductive layer 150 for the lower electrode is formed, thereby causing electrical shorts between adjacent elements of the lower electrode through the void of the third oxide layer 125.

Next, the third oxide layer 125 is subject to an anisotropic etching until the interlevel dielectric layer 110 is exposed. Accordingly, the third oxide layer 125 exists as spacers on the sidewalls of the bit lines 120 in the periphery region. The third oxide layer 125 is removed to prevent minutes cracking in the periphery region. Namely, in the case that the third oxide layer 125 remains between the bit lines 120 of the periphery region, the cracking may occur due to the thermal stress caused at the third oxide layer 125 during the following annealing process.

Figure 7:
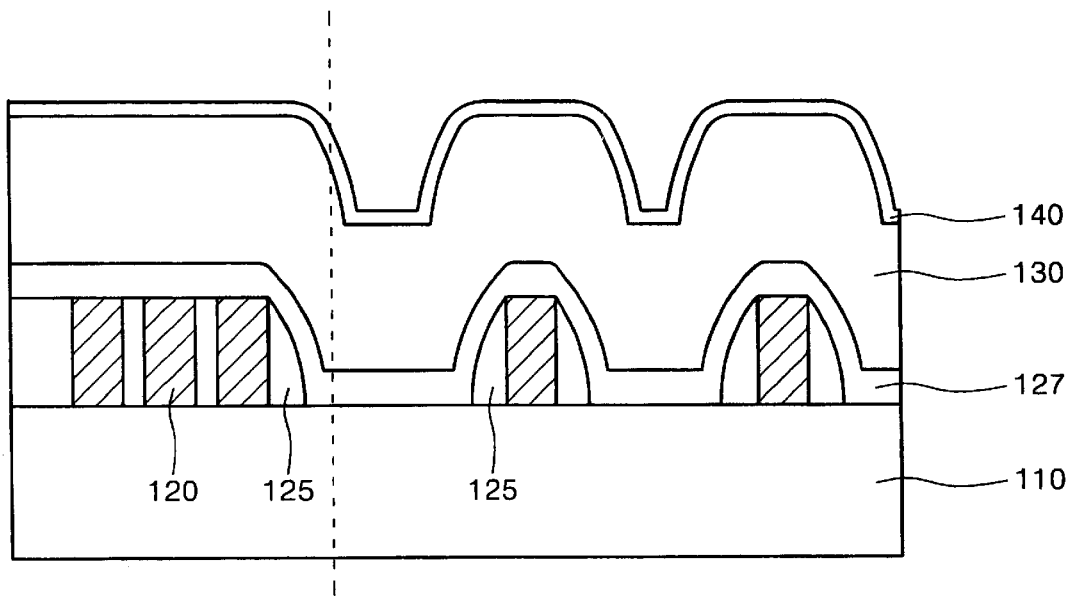

Referring to FIG. 7, an etch-blocking layer 127 is deposited on the entire resultant structure, to a thickness of about 1,500 Å. The etch-blocking layer 127 is preferably a monosilane high-temperature oxide (MS-HTO) layer, a dichlorosilane high-temperature oxide (DCS-HTO) layer, a low-pressure tetraethyl orthosilicate (LP-TEOS) layer or a plasma-enhanced tetraethyl orthosilicate (PE-TEOS) layer. The MS-HTO layer is produced by reacting $SiH_4$ gas with $N_2O$ gas at a temperature not less than 750° C., using low-pressure chemical vapor deposition (LPCVD). The DCS-HTO layer is formed by reacting $SiCl_2H_2$ with $N_2O$ at a temperature not less than 800° C., using an LPCVD method. The LP-TEOS layer is produced by a decomposition of TEOS gas at a temperature not less than 650° C., using an LPCVD method. The PE-TEOS layer is made by a decomposition of TEOS gas at the temperature not greater than 500° C., using plasma-enhanced chemical vapor deposition (PECVD).

Thereafter, a first oxide layer 130 is formed by depositing a BPSG layer to a thickness of 6,000 Å and planarizing the deposited BPSG layer by annealing for about 30 minutes at a temperature of 750° C. The BPSG layer preferably contains approximately 2% boron and 2% phosphorous by weight and more preferably 3.6% and 4.0%, respectively. An ARC layer 140 is then formed over the first oxide layer 130, to a thickness of 350 Å. The formation of the ARC layer 140 is optional.

Figure 8:
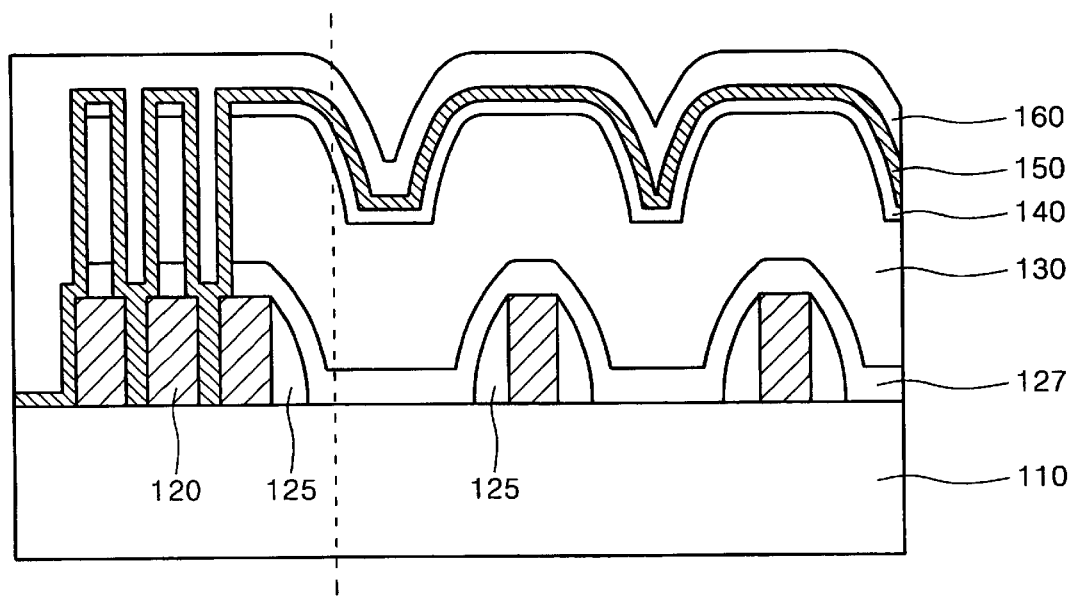

Referring to FIG. 8, the ARC layer 140, first oxide layer 130, etch-blocking layer 127 and third oxide layer 125 are sequentially subjected to anisotropic etching in the cell region, to expose the interlevel dielectric layer 110 and thereby form via-holes. Thereafter, a silicon conductive layer 150 is formed by depositing polysilicon over the structure having the via-holes, to a thickness of 500 Å. As described above, the silicon conductive layer 150 is self-aligned and in contact with the interlevel dielectric layer 110 but not so as to electrically short the bit lines 120. The silicon conductive layer 150 is coupled to the contact plug in the interlevel dielectric layer 110, to be substrate.

Figure 9:
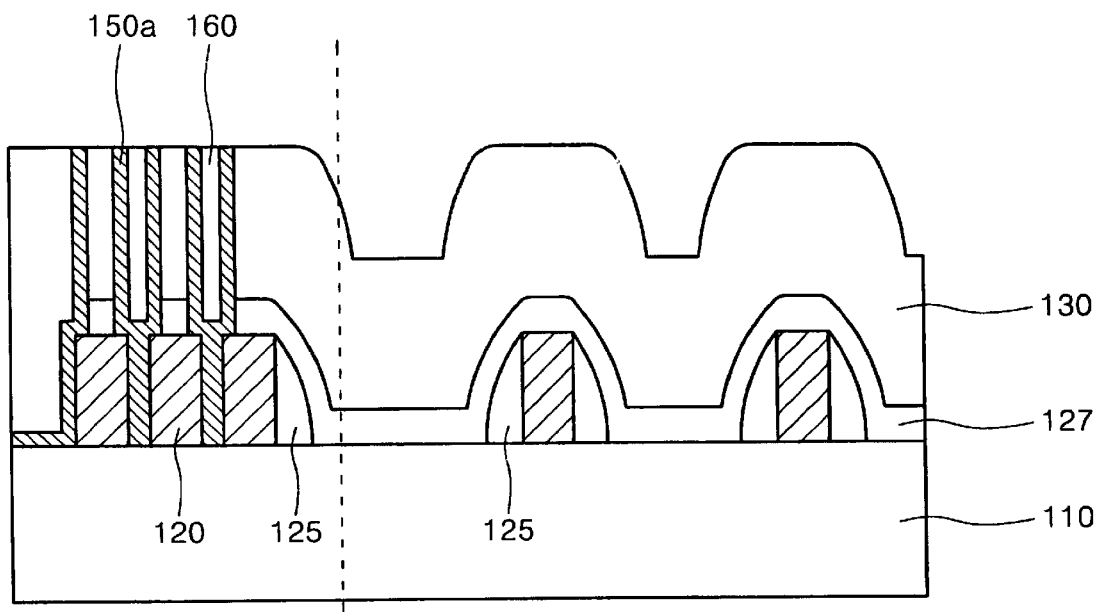

Thereafter, a second oxide layer 160 is formed by depositing a PSG layer which contains the phosphorous of in the range of 3.6% to 4.0% by weight, to fill the via-holes such that cell-region planarization is enabled, Referring to FIG. 9, the second oxide layer 160, silicon conductive layer 150 and ARC layer 140 are sequentially subjected to anisotropic etching, to expose the first oxide layer 130 and thereby form a lower electrode 150a.

Figure 1:
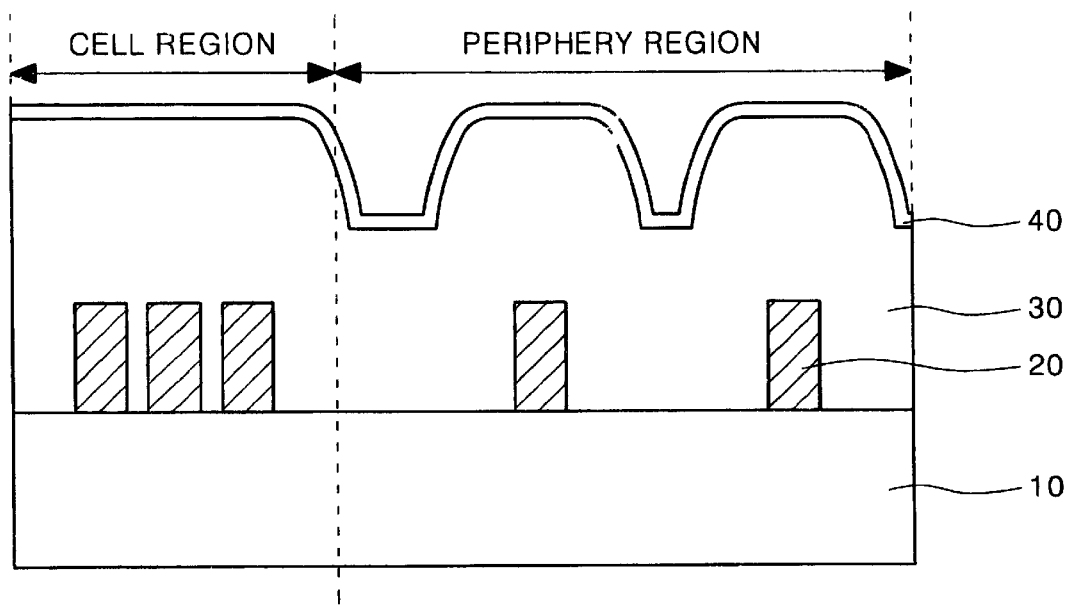
FIGS. 1 to 5 are cross-sectional views illustrating various steps of a method for fabricating a crown-type capacitor of a semiconductor device in accordance with the conventional art.
Figure 2:
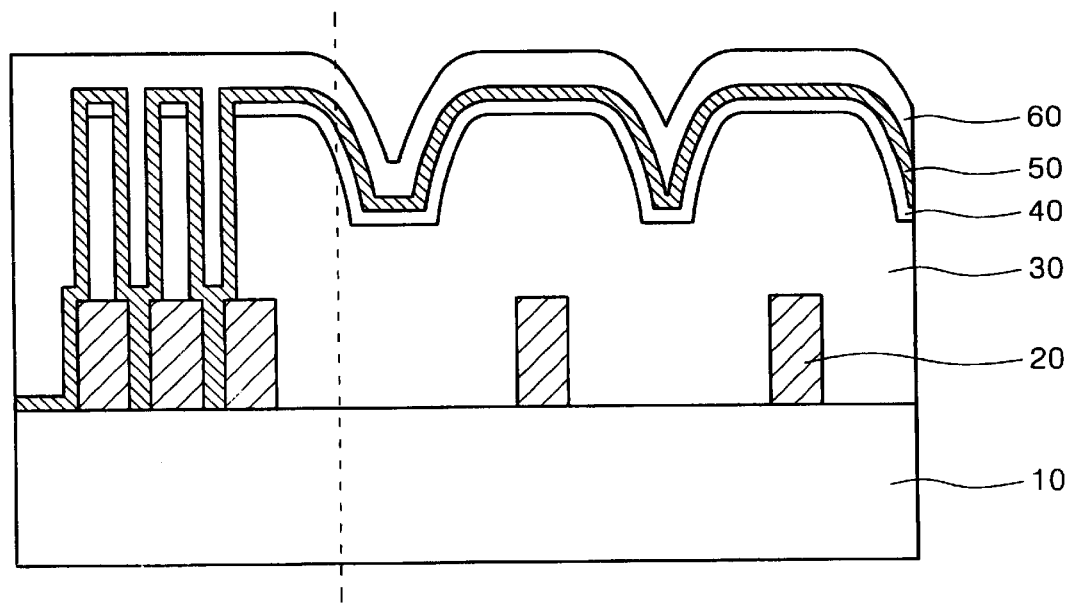
Figure 3:
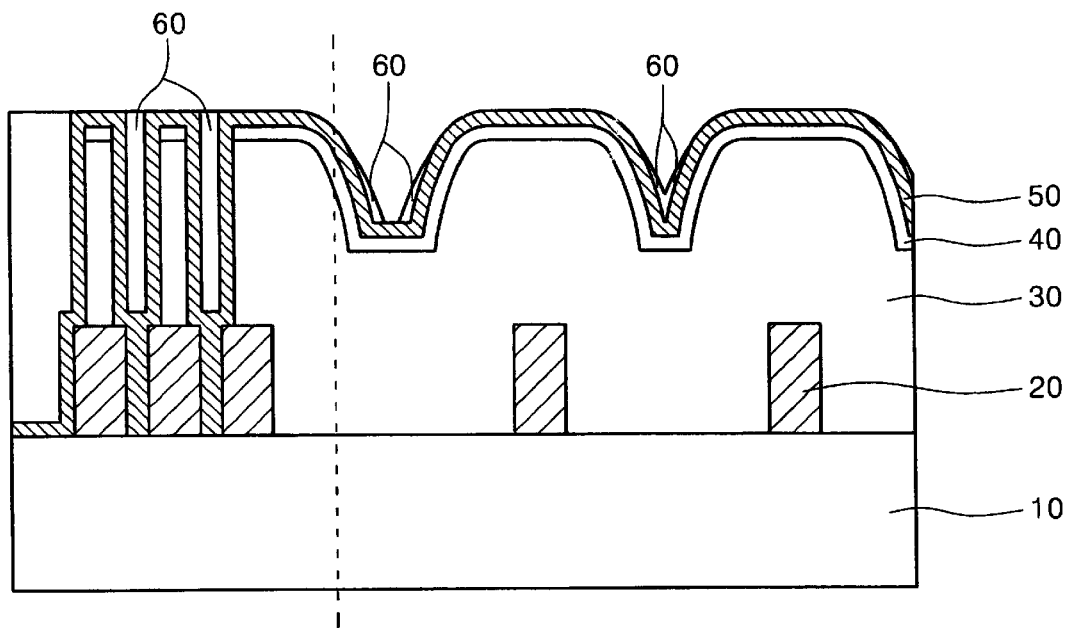
Figure 4:
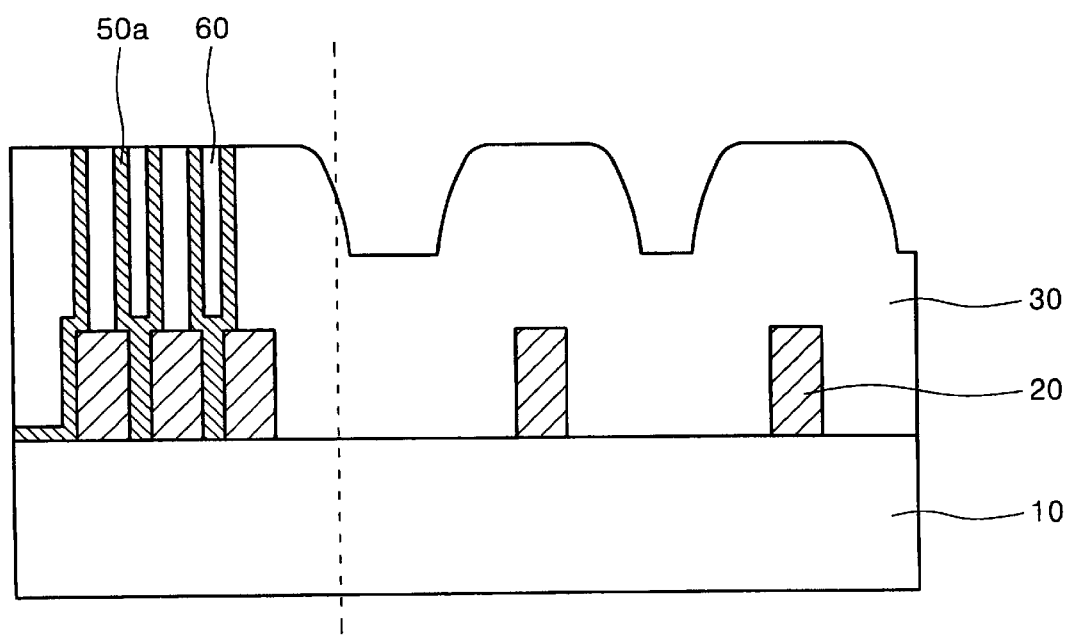
Figure 5:
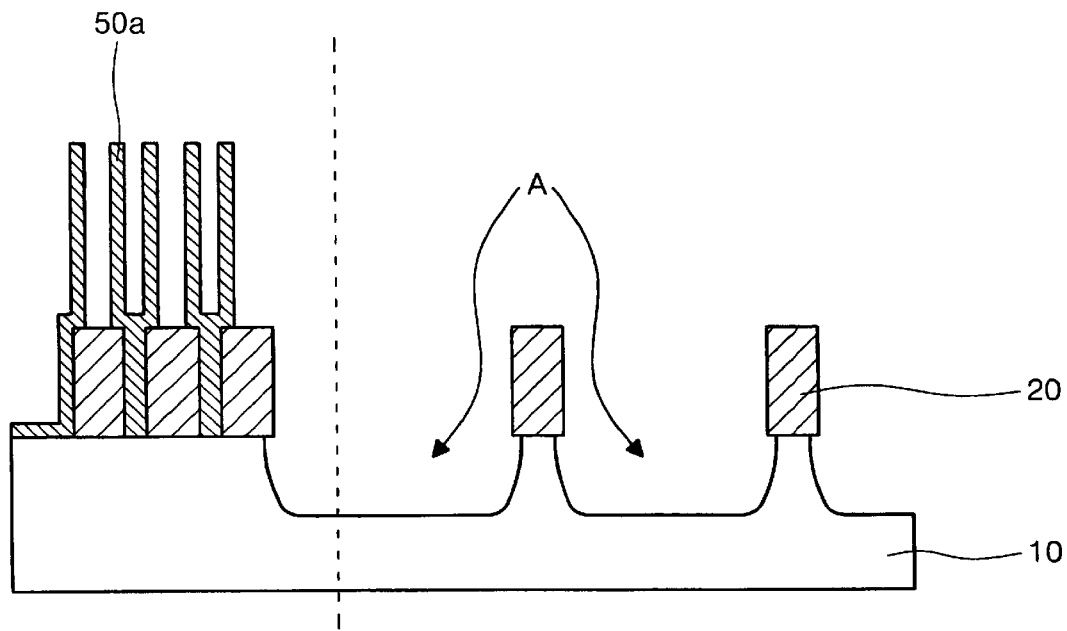
Figure 10:
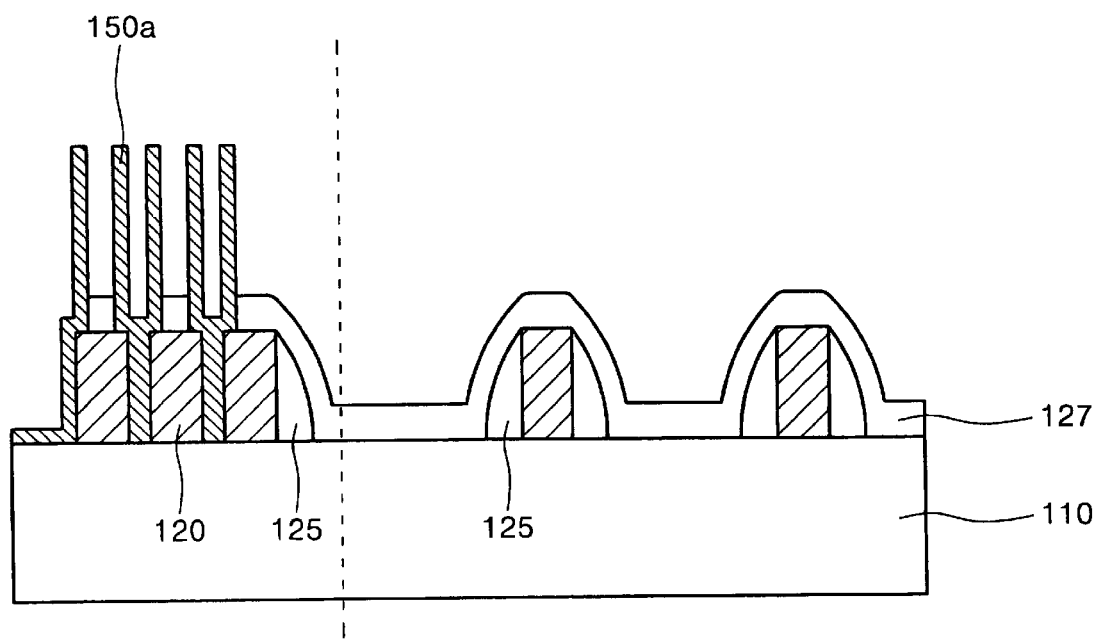

Referring to FIG. 10, the first and second oxide layers 130 and 160 are removed by a wet etching process using a chemical liquid whose ratio of deionized water to hydrofluoric acid is between 100:1 and 150:1. When hydrofluoric acid is used for the wet etching, the etching selectivity of the HTO layer (i.e., the etch-blocking layer 127) to the BPSG layer (i.e., the first oxide layer 130) is greater than 1:3, and the etching selectivity of the BPSG layer to the PSG (i.e., the second oxide layer 160) is about 1:1.5. Therefore, the etch-blocking layer 127 allows the first and second oxide layers 130 and 160 to be completely removed without damage to the interlevel dielectric layer 110, i.e, over-etching as shown in FIG. 5.

As described hereinbefore, the method for fabricating the crown-type capacitor according to the present invention forms the lower electrode of the capacitor using three layers: an oxide layer (125) for filling the bit line gaps, an etch-blocking layer (127), and an oxide layer (130) for capacitor formation. In this regard, the present invention can provide an advantage in that the etch-blocking layer protects the interlevel dielectric layer at the removal of the first and second oxide layers, so that there is no loss of the interlevel dielectric layer. The present invention provides another advantage in that the bit lines do not shift nor collapse due to any such loss of the interlevel dielectric layer.

In addition, since the etch-blocking layer can sufficiently protect the interlevel dielectric layer, the first and second oxide layers can be fully etched or even over-etched. Thus, the present invention can prevent the second oxide layer from remaining on the inner walls of the lower electrode elements, so that maximum surface area can be obtained for the lower electrode and a precise electrode can be formed. As a result, the present invention can improve the electrical reliability in the capacitor.

Also, the present invention obviates the need to leave a predetermined thickness of the first oxide layer and thereby eliminates the possibility of thermal stress cracking in the periphery region. Further, it is possible to fill the bit line gaps with the third oxide layer without a void, and thereby confidently make the electrical connection between the contact portions when the self-aligned contact is formed, and further prevent capacitors from being electrically shorted.

Additionally, since the etch-blocking layer is capping the upper portions of the bit lines in the periphery region, the present invention provides an advantage in that the bit lines are insulated from the upper electrode of the capacitor without an additional process.

It is to be understood that the embodiments described herein are merely illustration of the principles of the invention. Various modification may be made thereto by persons skilled in the art which will embody the principles of the invention and fall within the scope thereof.

What is claimed:

1. A method for fabricating a crown-type capacitor of a semiconductor device, comprising the steps of:

forming a plurality of bit lines on the interlevel dielectric layer in a cell region and a periphery region of a substrate;

forming a third oxide layer to fill gaps existing between said plurality of bit lines in the cell region, said third oxide layer covering on the sidewalls of the bit lines;

forming an etch-blocking layer using CVD and a first oxide layer over the entire structure obtained by forming said third oxide layer;

forming a plurality of via-holes by anisotropically etching said first oxide layer, said etch-blocking layer and said third oxide layer, to expose said interlevel dielectric layer in said cell region;

forming a silicon conductive layer, for forming a lower electrode of the crown-type capacitor, over the cell region of the structure having said plurality of via-holes to make electrical contact with said interlevel dielectric layer, and then forming a second oxide layer to fill interspaces of said silicon conductive layer in the cell region;

completing said lower electrode by anisotropically etching said second oxide layer and said silicon conductive layer, to expose said first oxide layer; and removing said first and second oxide layers.

2. The method for fabricating a crown-type capacitor of a semiconductor device as set forth in claim 1, wherein said third oxide layer is composed of an $O_3$-TEOS layer.

3. The method for fabricating a crown-type capacitor of a semiconductor device as set forth in claim 1, wherein said etch-blocking layer is one selected from the group consisting of HTO layers, an LPTEOS layer and a PETEOS layer.

4. The method for fabricating a crown-type capacitor of a semiconductor device as set forth in claim 3, wherein said HTO layers are formed by reacting $N_2O$ gas with one selected from the group consisting of $SiH_4$ gas and $SiCl_2H_2$ gas, in an LPCVD deposition step.

5. The method for fabricating a crown-type capacitor of a semiconductor device as set forth in claim 1, wherein said first oxide layer is composed of a BPSG layer.

6. The method for fabricating a crown-type capacitor of a semiconductor device as set forth in claim 5, wherein said BPSG layer contains boron and phosphorous each of which is in the range of 3.6% to 4.0% by weight.

7. The method for fabricating a crown-type capacitor of a semiconductor device as set forth in claim 1, wherein said second oxide layer is composed of a PSG layer.

8. The method for fabricating a crown-type capacitor of a semiconductor device as set forth in claim 7, wherein said PSG layer contains phosphorous of between 3.6% by weight and 4.0% by weight.

9. The method for fabricating a crown-type capacitor of a semiconductor device as set forth in claim 1, wherein said removing step includes a wet etching step which uses a chemical liquid whose ratio of deionized water to hydrofluoric acid is between 100:1 and 150:1.

10. The method for fabricating a crown-type capacitor of a semiconductor device as set forth in claim 1, wherein said interlevel dielectric layer is composed of a BPSG layer.

* * * * *